United States Patent [19]

Mizuishi et al.

[11] Patent Number: 4,819,857
[45] Date of Patent: Apr. 11, 1989

[54] METHOD FOR FABRICATING COMPOSITE STRUCTURE

[75] Inventors: Kenichi Mizuishi; Masahide Tokuda, both of Hachioji; Katuaki Chiba, Akigawa, all of Japan

[73] Assignee: Hitachi, Ltd., Tokyo, Japan

[21] Appl. No.: 109,449

[22] Filed: Oct. 19, 1987

[30] Foreign Application Priority Data

Oct. 17, 1986 [JP] Japan .................. 61-245252
Mar. 13, 1987 [JP] Japan .................. 62-56528

[51] Int. Cl.⁴ .................................. B23K 35/14
[52] U.S. Cl. ........................ 228/121; 228/123; 228/124; 228/233; 228/246; 228/263.12
[58] Field of Search .................. 228/121–124, 228/208, 221, 233, 237, 246, 249, 252, 254, 263.12, 189

[56] References Cited

U.S. PATENT DOCUMENTS

| | | | |
|---|---|---|---|
| 3,648,357 | 3/1972 | Green, Jr. ................. | 228/246 |
| 3,711,939 | 1/1973 | Stoll ......................... | 228/246 |
| 4,574,470 | 3/1986 | Burt ......................... | 228/123 |
| 4,645,116 | 2/1987 | Henein et al. ............ | 228/123 |
| 4,650,107 | 3/1987 | Keser ....................... | 228/123 |
| 4,709,849 | 12/1987 | Socolowski ............. | 228/246 |

FOREIGN PATENT DOCUMENTS

| | | | |
|---|---|---|---|
| 14069 | 2/1981 | Japan ................. | 228/123 |
| 94749 | 5/1985 | Japan ................. | 228/123 |
| 214536 | 10/1985 | Japan ................. | 228/123 |
| 125025 | 6/1986 | Japan ................. | 228/123 |

*Primary Examiner*—Fred A. Silverberg
*Assistant Examiner*—Samuel M. Heinrich
*Attorney, Agent, or Firm*—Antonelli, Terry & Wands

[57] ABSTRACT

A method for fabricating a composite structure, in which an intermediate member is sandwiched between first and second members, is disclosed. In this method, the intermediate member is disposed along the periphery of a spatial region formed between facing surfaces of the first and second members so that the spatial region is enclosed by the intermediate member, the fluidity of the intermediate member is enhanced under an atmosphere having a predetermined pressure, and then the pressure of the atmosphere is increased to make the intermediate member flow into the spatial region.

21 Claims, 8 Drawing Sheets

METHOD FOR FABRICATING COMPOSITE STRUCTURE

BACKGROUND OF THE INVENTION

The present invention relates to a method for fabricating a composite member, and more particularly to a composite structure fabricating method suited to reliably bond a semiconductor pellet to a substrate.

When a semiconductor pellet is bonded to a heat sink or wiring board, a bonding layer is required to have low thermal resistance and high mechanical strength. In a conventional method disclosed in a Japanese patent application No. JP-A-60-214,536 for forming a bonding layer which is low in thermal resistance (hereinafter referred to as "A-method"), a groove is formed at a central portion of the rear surface of a semiconductor pellet, and the rear surface is bonded to a package substrate through a fusible material, to prevent a void from being generated in a bonding layer. Further, according to another conventional method disclosed in a Japanese patent application No. JP-A-61-125,025 (hereinafter referred to as "B-method"), in order to solve a problem that when a thermal strain is produced by changing ambient temperature periodically or by other means, a pellet crack is generated and thus the composite structure has low mechanical strength, a eutectic metal plate having a plurality of through holes is used as a bonding member, and as semiconductor pellet is pressed against the bonding member, to make a bonding layer voidless, thereby preventing the generation of pellet crack.

In the A-method, a groove is formed in the rear surface of a silicon chip, to improve the wettability of the rear surface with a bonding material (for example, an Au-Si alloy). In more detail, gas can readily escape from a bonding region through the groove, and thus the generation of void is prevented.

According to the inventors' experience, however, the A-method can exhibit the above effect only for particular cases, for the following reasons. For example, in a case where a compound semiconductor chip is used in place of the silicon chip, or Pb-Sn solder is used in place of Au-Si alloy, it is difficult for the A-method to produce the above effect. Firstly, the A-method is inapplicable to a device, in which it is not desirable, from the viewpoint of a fabricating process or reliability, to form a groove at a central portion of the rear surface of a pellet. Secondly, in order to improve the wettability for solder, it is necessary to metallize the whole area of side walls of the groove formed in the rear surface of a semiconductor chip, and thus there arise problems that an uneven surface has to be uniformly metallized, and that a portion insufficiently metallized is not wetted well with solder and thus may induce the generation of void.

Further, only for particular cases, the B-method produce the effect of making a bonding layer voidless, thereby preventing the generation of pellet crack and reducing the thermal resistance of the bonding layer. The reason is as follows.

In a case where a eutectic metal plate having a plurality of through holes is used as a bonding member, and a pellet is pressed against the bonding member to make a bonding layer voidless, the surface of the remaining portion of the eutectic metal other than that portion thereof which flows into and fills up the through holes, is usually coated with a native oxide film, and thus the bonding surface of the pellet is not wetted uniformly with the eutectic metal. Further, due to the generation of local stress, the mechanical strength of a bonding region is reduced and the temperature distribution in a bonding layer is not uniform. Thus, the reliability of the bonding processing is degraded.

Further, in a case where fusible materials other than gold containing eutectic metals, for example, Pb-Sn solder whose surface is readily subjected to natural oxidation, is used in the B-method, it is very difficult for the B-method to produce the expected effect.

SUMMARY OF THE INVENTION

It is an object of the present invention to provide a method for reliably and readily fabricating a composite structure with a voidless bonding layer which has excellent mechanical strength and low thermal resistance, independent of the material of semiconductor pellet, the kind of fusible material, and the shape and size of the bonding surface.

In order to attain the above object, according to the present invention, there is provided a composite structure fabricating method which comprises the steps of: disposing an intermediate member at a peripheral portion of a spatial region formed between facing surfaces of a semiconductor pellet and a wiring board so that the spatial region is enclosed by the intermediate member, the semiconductor pellet and the wiring board being used for forming a composite structure, the intermediate member being made of a fusible material; heating the intermediate member under an atmosphere having a predetermined pressure to increase the fluidity of the fusible material; and increasing the pressure of the atmosphere to make the fusible material flow into the spatial region.

When the fusible material is fused under an atmosphere having a pressure $P_1$, only a peripheral portion of each of the facing surfaces (that is, bonding surfaces) is wetted with and kept in close contact with the fused material, and thus a spatial region having a volume $V_1$ is hermetically sealed by the fused material. The pressure of this spatial region is equal to $P_1$. When the pressure of the atmosphere is increased from $P_1$ to $P_2$ (where $P_2 \gg P_1$), a pressure difference is generated between the hermetically sealed spatial region and the outside thereof, and the fused material flows inwards. Thus, the volume of the above spatial region is reduced from $V_1$ to $(P_1/P_2)V_1$. Accordingly, when the pressure ratio $P_1/P_2$ is made small, for example, equal to a value of 1/100 to 1/1,000, a substantially voidless bonding layer is formed which has high thermal conductivity.

Even in a case where those facing surfaces of the pellet and the substrate which are to be bonded to each other include an unflat surface portion, if the above spatial region can be hermetically sealed by the fusible material, the spatial region will be filled with the fusible material.

Further, in a case where solder is used as the fusible material, the surface of solder is usually coated with a native oxide film. However, according to the present invention, pure solder flows into the above spatial region in such a manner that the native oxide film is broken. Accordingly, the bonding surfaces of the pellet and the board are wetted well with solder, without using any flux. Thus, a fluxless solder layer can be formed which has excellent in mechanical strength and thermal conductivity.

DESCRIPTION OF THE PREFERRED EMBODIMENTS

Now, two embodiments of a composite structure fabricating method according to the present invention will be explained below, with reference to the drawings.

EMBODIMENT I

Figure 1A:
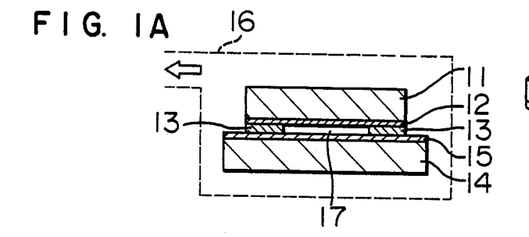
FIGS. 1A, 1B, 1C and 1D are sectional views for explaining several steps of a first embodiment of a composite structure fabricating method according to the present invention.
Figure 1B:
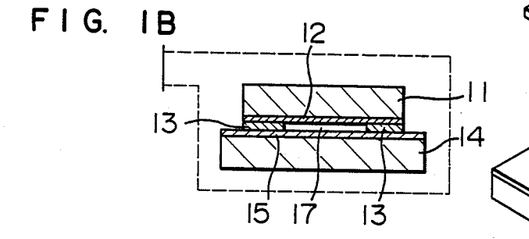
Figure 1C:
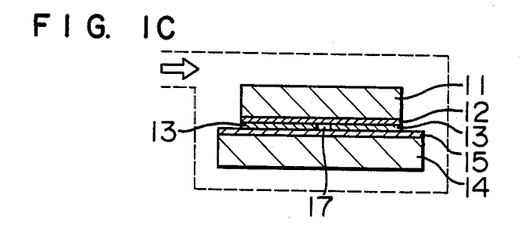
Figure 1D:
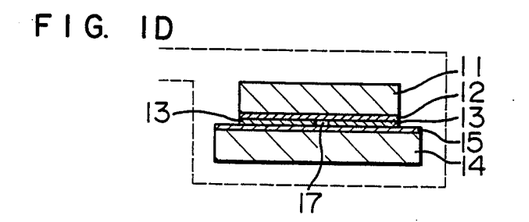
Figure 2:
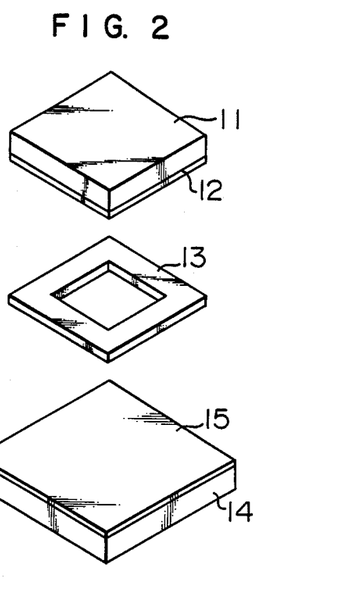
FIG. 2 is an exploded, perspective view showing members which are used in the first embodiment.

FIGS. 1A to 1D are sectional views for explaining several steps which are contained in a first embodiment to form a substantially voidless solder layer, and FIG. 2 shows constituent members which are used in the present embodiment. In FIGS. 1A to 1D and 2, reference numeral 11 designates a silicon chip including a large scale integration circuit (LSI) and having dimensions of 1 cm by 1 cm, 12 a metallized layer formed on the rear surface of the silicon chip 11 and having a three-layer structure of Ti-Ni-Au, 13 a looped preform which is made of Pb-Sn solder containing 40% tin by weight and has a thickness of 100 μm, and whose beltlike portion has a width of 1 mm, 14 a heat sink made of SiC ceramics, and 15 a metallized layer formed on the surface of the heat sink 14 and having a three-layer structure of Ti-Ni-Au. It is to be noted that only members indispensable for making up a solder bonded structure according to the present embodiment are shown in FIGS. 1A to 1D and 2, and other members necessary for the above structure such as the wiring on the chip 11 are all omitted for the sake of brevity.

Now, explanation will be made of the fabrication of a voidless-solder bonded composite structure according to the present embodiment, with reference to FIGS. 1A to 1D.

Referring first to FIG. 1A, the silicon chip 11, the solder preform 13 and the heat sink 14 are piled up at the surface of a heating table (not shown) which is placed in a vacuum vessel 16, and the pressure in the vacuum vessel 16 is reduced to 1 Torr. At this time, the solder preform 13 is kept at a solid state. Accordingly, a small gap is inevitably formed between the solder preform 13 and each of the silicon chip 11 and the heat sink 14. Thus, the pressure in an inner region 17 surrounded by the solder preform 13 is also reduced to 1 Torr. Incidentally, arrows in FIGS. 1A and 1C designate the direction of gas flow.

In the above state, the solder preform 13 is heated to about 220° C., to fuse the preform, thereby increasing the fluidity thereof. Thus, the preform 13 is kept in close contact with the metallized layers 12 and 15, or an intermetallic reaction is generated between the preform 13 and each of the metallized layers 12 and 13. At this time, the inner region 17 having a volume $V_1$ is completely isolated from the outside by the preform 13, and the pressure in the inner region 17 is equal to $P_1$ (namely, 1 Torr). FIG. 1B shows such a state.

Next, the pressure in the vacuum vessel 16 is returned to 760 Torr (namely, $P_2$) in a state that the solder preform 13 is fused by heating. Accordingly, the solder preform 13 in a molten state is applied with an external pressure of 760 Torr, and thus the volume of the inner region 17 is greatly reduced, that is, is reduced to $V_2$. FIG. 1C shows such a state.

Finally, the heating is stopped to solidify the solder layer 13, thereby forming a composite structure with a substantially voidless solder layer. FIG. 1D shows such a state.

A large number of composite structures were fabricated in the above-mentioned manner, and it was confirmed that the void reduction ratio $V_2/V_1$ lay in a range from 1/100 to 1/200. The volume $V_2$ was determined from that cross sectional area of a void which was obtained from the soft X-ray image of the void, and the final thickness of the solder layer 13.

Figure 3:
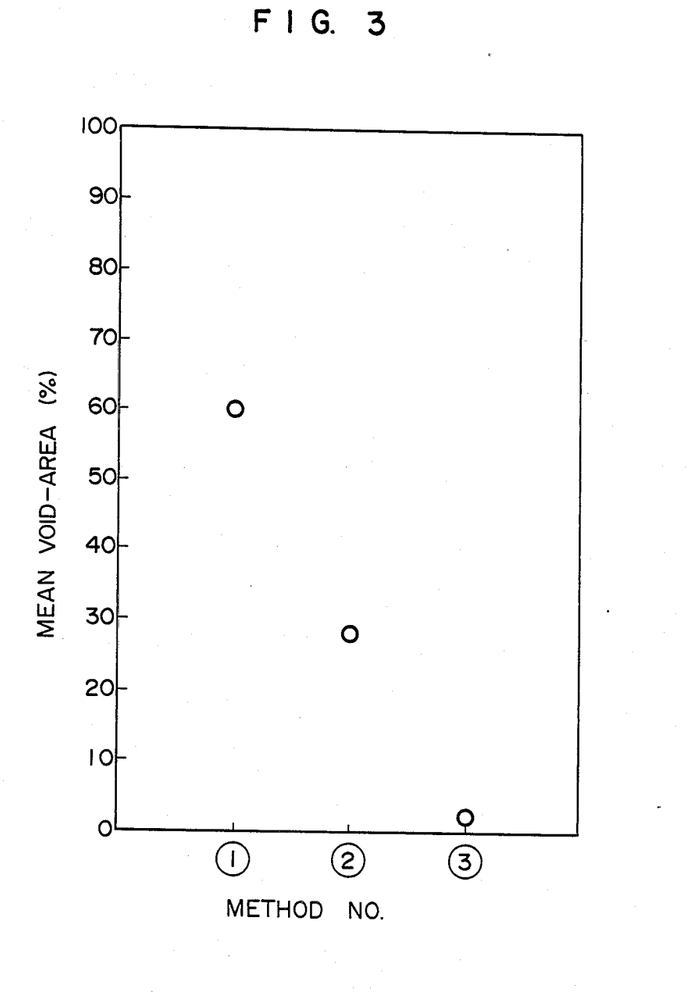
FIG. 3 is a graph for explaining the effect of the first embodiment.

FIG. 3 is a graph showing the mean void-area of solder layers according to the present embodiment and the mean void-area of solder layers according to each of two conventional methods. In a first conventional method (that is, method ①), the whole area of the bonding surface of one of members which are to be bonded to each other, is previously coated with Pb-Sn solder containing 40% tin by weight. That is, a solder layer is previously formed. In a second conventional method (that is, method ②), the whole area of the bonding surface of one of the members is previously coated with solder as in the method ①, respective bonding surfaces of the members are put into contact with each other, and then four processing steps, that is, a reduction in ambient pressure, the fusion of solder, the return of ambient pressure to normal pressure, and the solidification of solder are successively made. In the present embodiment (that is, method ③), the solder preform is disposed only at a periferal portion of a spatial region formed between bonding surfaces of the members.

Figure 4A:
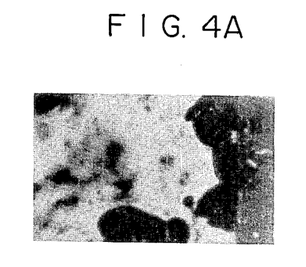
FIGS. 4A, 4B, 4C and 4D are microphotographs each showing an image which is formed by soft X-rays having passed through a composite structure with a solder layer.
Figure 4B:
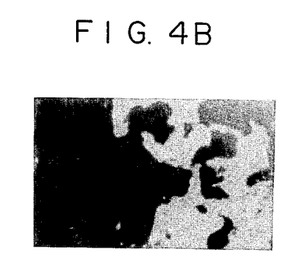
Figure 4C:
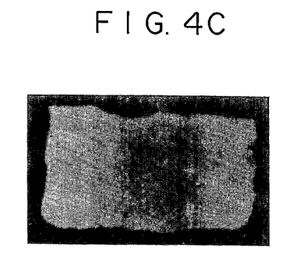
Figure 4D:
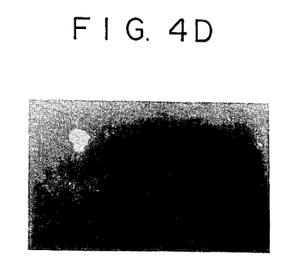

As shown in FIG. 3, a mean void-area of 30 to 60% is obtained for solder layers according to each of the methods ① and ②, and a mean void-area of around 1% is obtained for solder layers according to the method ③. That is, the present embodiment can produce a remarkable void reduction effect. FIGS. 4A to 4D are microphotographs of images, each of which is formed by soft X-rays having passed through a solder bonded composite structure. In FIGS. 4A to 4D, a white portion corresponds to a void, and a black portion corresponds to a solder layer. FIG. 4A shows the soft X-ray image of a composite structure according to the method ①, FIG. 4B shows that of a composite structure according to the method ②, FIG. 4C shows that of the structure of FIG. 1B according to the present embodiment, and FIG. 4D shows that of the structure of FIG. 1D according to the present embodiment.

Now, additional explanation will be made of the methods ①, ② and ③.

In the method ①, due to a little undulation at the surface of the pre-coated solder layer, air is introduced into the solder layer when the solder layer is bonded to the surface of the other member. Thus, it is difficult to obtain a void area less than 50% reproducibly.

In the method ②, a void confined in the solder layer is made small in volume, but a void can be generated at that peripheral portion of the solder layer which is exposed to ambient atmosphere. Hence, the void area of the solder layer fluctuates widely, and thus it is difficult to make the void area of the solder layer less than 20%. Further, in both of the methods ① and ②, an oxide film is present at the surface of the pre-coated solder layer, and it is very difficult to wet the surface of the other member well with solder.

While, according to the method ③ (that is, the present embodiment), the inner region 17 surrounded by the solder preform (that is, an intentionally formed void) is substantially kept at a vacuum state and is isolated from ambient atmosphere by the solder preform, in an initial stage of the present embodiment. Then, pure solder is introduced into the inner region 17 in such a manner that the native oxide film on the solder preform is broken. Thus, respective bonding surfaces of a pair of members can be wetted with solder in an ideal manner. This fact will be explained below in more detail, with reference to FIGS. 5A and 5B.

Figure 5A:
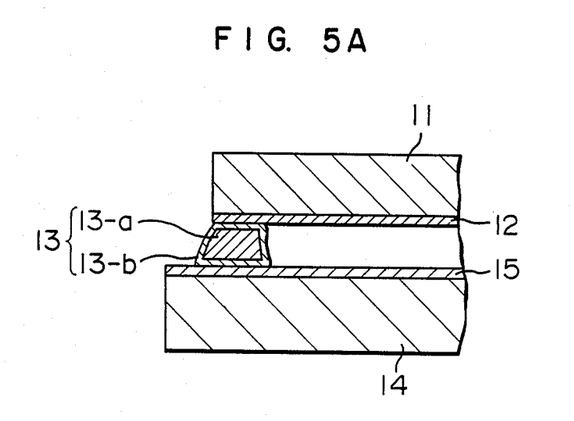
FIGS. 5A and 5B are sectional views for explaining that pure solder flows between a pellet and a substrate after an oxide film has been broken.

The solder preform 13 is made by pouring molten solder into a mould, or is punched out from a solder sheet. In a period when the preform 13 is made in the above manner and stands in contact with air, a native oxide film 13-b shown in FIG. 5A is formed on the surface of pure solder 13-a. Accordingly, in the step of FIG. 1B, the oxide film 13-b of the solder preform 13 is kept in contact with the metallized layers 12 and 15. (In this case, a state that a part of the oxide film 13-b is broken and the pure solder 13-a flows out, can be realized by applying a load to the silicon chip 11, or other methods. In a conventional method, a mechanical vibration is applied to the silicon chip 11, to produce such a state, thereby improving the wettability for solder.

Figure 5B:
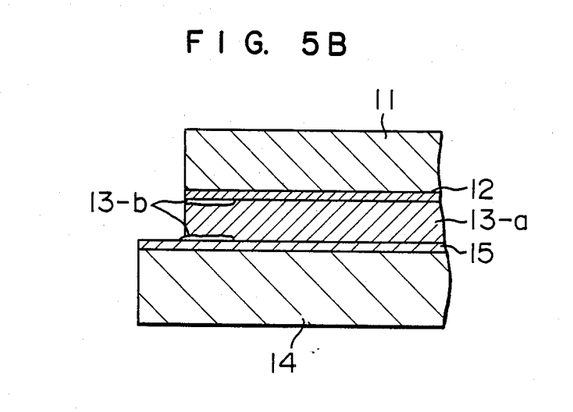

FIG. 5B corresponds to FIG. 1C, and shows a state that the oxide film 13-b has been broken and the pure solder 13-a has flowed into the inner region 17. It was confirmed by Auger electron spectroscopy that the oxide film 13 was present only at a peripheral portion of each metallized layer.

As mentioned above, according to the present embodiment, each of the metallized layers 12 and 15 is uniformly wetted with solder. Thus, according to the present embodiment, a reduction in bonding strength due to a fact that a bonding surface is not wetted uniformly with solder, never occurs, though the above reduction is generated in the B-method disclosed in the above-referred Japanese patent application No. JP-A-61-125,025.

As is evident from the above explanation, according to the present embodiment, the void of the solder layer is reduced in a surprising degree, and moreover a solder bonded composite structure can be readily formed, in which the bonding surfaces of two members are wetted well with solder. Accordingly, when a semiconductor chip is bonded to a heat sink by the present embodiment, a semiconductor device formed has a remarkable heat-radiating ability, and hence will exhibit excellent thermal performance and reliability.

Next, it will be explained, on the basis of the principle of the present invention, that the thickness of a solder layer according to the present embodiment can be readily controlled.

Figure 6A:
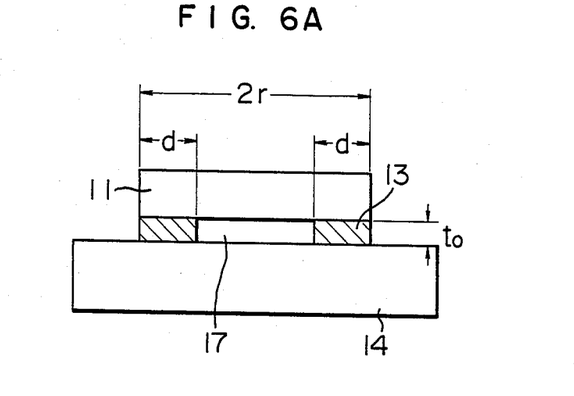
FIGS. 6A and 6B are schematic diagrams for explaining the principle of the present invention.
Figure 6B:
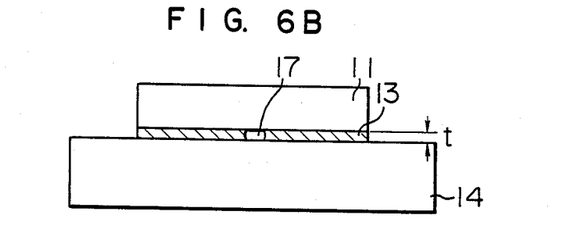

FIGS. 6A and 6B are schematic diagrams for explaining the principle of the present invention, and show the steps of FIGS. 1B and 1D, respectively. Referring to FIGS. 6A and 6B, when the thickness of the solder preform, the thickness of the bonding solder layer, the width of beltlike portions of the solder preform, and the length of one side of the solder preform are expressed by $t_0$, $t$, $d$, and $2r$, respectively, we can obtain the following formula:

$$\frac{t}{t_0} \approx \frac{d}{r}\left(2 - \frac{d}{r}\right) \quad (1)$$

where $0 < (d/r) \leq 1$

Figure 7:
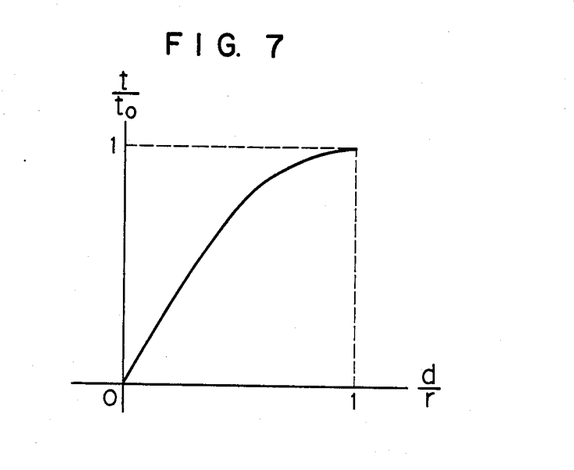
FIG. 7 is a graph showing a relationship between the shape of a solder preform and the thickness of a solder layer.

FIG. 7 is a graph which shows a relation between $d/r$ and $t/t_0$ given by the formula (1).

In the present embodiment, the thickness $t_0$, half-length $r$ and width $d$ with respect to the solder preform 13 are made equal to 100 μm, 5 mm and 1 mm, respectively, by way of example. Accordingly, the thickness $t$ of the bonding solder layer calculated from the formula (1) is nearly equal to 36 μm. This value corresponds to the measured values of the thickness $t$ for a multiplicity of samples lying in a range from 30 to 40 μm. In other words, since the bonding solder layer has a void of 1% or less, the thickness of the bonding solder layer can be accurately controlled on the basis of the formula (1). Thus, according to the present embodiment, the thickness of the bonding solder layer can be accurately determined so that a composite structure is optimum in thermal and mechanical properties.

The above effect of the present embodiment is based upon the void reducing action of the present invention. The physical foundation of the void reducing action will be explained below. This action is based upon Boyle-Charles' law. A change of the volume $V$ of the inner region 17 which is hermetically sealed by the solder preform 13 as shown in FIG. 6A, from $V_1$ to $V_2$ is related to a change of the pressure $P$ in the inner region 17 from $P_1$ to $P_2$ to Boyle-Charles' law, that is, the following equation:

$$\frac{PV}{T} = \text{constant} \quad (2)$$

where T indicates an absolute temperature.

The following table shows the change of state of the hermetically sealed region 17 in steps (b), (c) and (d) which are shown in FIGS. 1B, 1C and 1D, respectively.

| step | P | V | T |
|------|---|---|---|
| (b) | $P_1$ | $V_1$ | $T_1$ |
| (c) | $P_2$ | $V_1\left(\dfrac{P_1}{P_2}\right)$ | $T_1$ |
| (d) | $P_2$ | $V_1\left(\dfrac{P_1}{P_2}\right)\left(\dfrac{T_2}{T_1}\right)$ | $T_2$ |
| (d') | $P_2\left(\dfrac{T_3}{T_2}\right)$ | $V_1\left(\dfrac{P_1}{P_2}\right)\left(\dfrac{T_2}{T_1}\right)$ | $T_3$ |

In the present embodiment, $P_1$, $P_2$, $T_1$, $T_2$ and $T_3$ are made equal to 1 Torr, 760 Torr, 220° C. (temperature of heating table), 183° C. (melting point of solder) and 25° C. (normal temperature), respectively, by way of example. It is to be noted that the step (d) is followed by the step (d'), in which the solidified solder is cooled to normal temperature.

As shown in the above table, the final volume $V_2$ of the void confined in the bonding solder layer is equal to $V_1(P_2/P_1)(T_2/T_1)$, which is nearly equal to $1.2 \times 10^{-3} V_1$. Thus, the void volume of the bonding solder layer in the final stage can be determined from the initial volume $V_1$ of the inner region 17.

EMBODIMENT II

Figure 8:
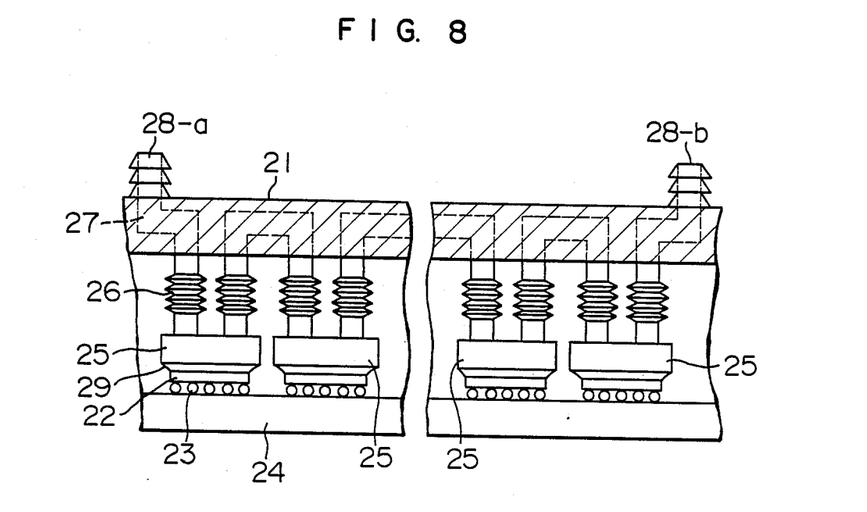
FIG. 8 is a schematic diagram showing a multichip cooling module which is formed by a second embodiment of a composite structure fabricating method according to the present invention.

In the EMBODIMENT I, a single semiconductor pellet is bonded to a heat sink by solder. In other words, the EMBODIMENT I deals with a case where the semiconductor pellet is relatively small in weight and the bonding surfaces of the pellet and the heat sink are flat. While, FIG. 8 shows a case where each of a plurality of semiconductor chips 22 is mounted on a corresponding one of the cooling blocks 25 through a solder layer 29 to form a multi-chip cooling module. The method described in the EMBODIMENT I is not applicable to such a case.

Now, explanation will be made of a second embodiment of a composite structure fabricating method according to the present invention, with reference to FIGS. 8 to 11.

Figure 9:
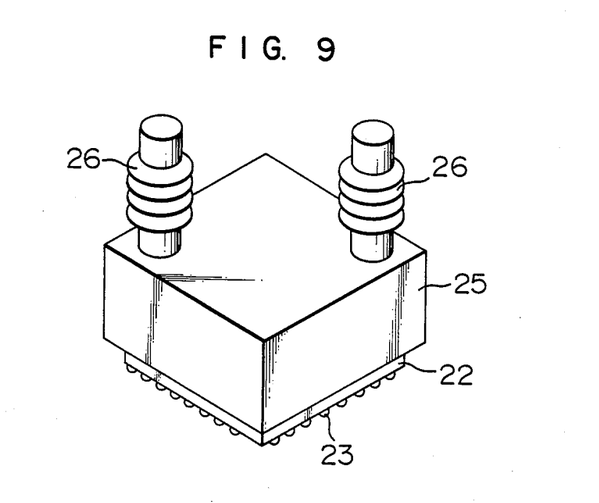
FIG. 9 is a perspective view showing the cooling block of FIG. 8.

FIG. 8 shows a multi-chip cooling module similar to a module which is disclosed in a Japanese patent application No. JP-A-60-94,749 entitled "integration circuit chip cooling device." Referring to FIG. 8, silicon chips 22 each having a large scale integration circuit are enclosed in and cooled by a cooling module 21. Further, the silicon chips 22 are connected to a circuit board 24 through solder bumps 23. A fin (not shown) is provided in a cooling block 25, to be connected to a coolant path 27 through bellows 26. That is, when cooling water is caused to flow from an inlet 28-a to an outlet 28-b, heat is removed from the cooling block. The silicon chip 22 is bonded to the cooling block 25 through a solder layer 29. FIG. 9 is a perspective view showing a cooling block 25 which is mounted with a silicon chip 22.

Now, explanation will be made of the present embodiment for bonding a plurality of semiconductor chips to cooling blocks through voidless solder layers, at the same time.

As can be readily seen from the structure of cooling module shown in FIG. 8, due to variations in length of the flexible bellows 26, a warp in the circuit board 24, variations in height of the solder bumps 23, and others, the distance between the cooling block 25 and the silicon chip 22 fluctuates. Accordingly, when the silicon chip 22 is bonded to the cooling block 25 by solder, it is required to apply an appropriate vertical load to the cooling block 25 so that molten solder is kept in close contact with the chip 22 and the block 25. However, according to inventors' experiments, when a vertical load of 20 to 30 g/cm² is applied to the cooling block 25 in a state that Pb-Sn solder containing 60% tin by weight is fused, the greater part of fused solder flows out from the periphery of the silicon chip 22.

Figure 10A:
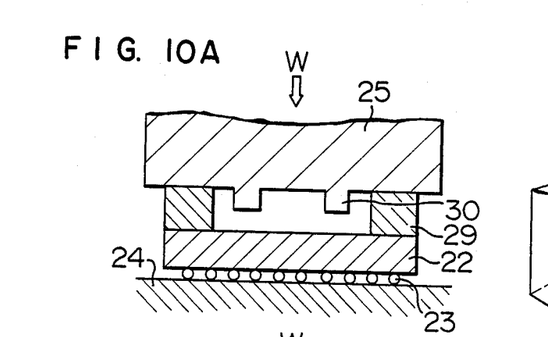
FIGS. 10A, 10B and 10C are sectional views for explaining a few steps of the second embodiment.
Figure 10B:
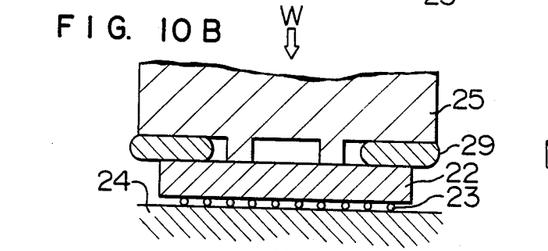
Figure 10C:
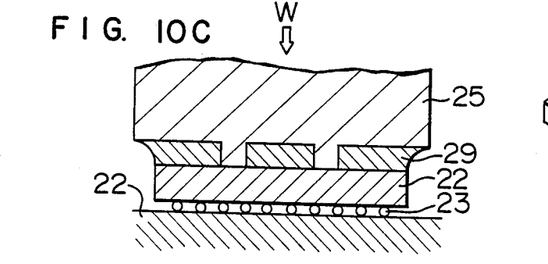
Figure 11:
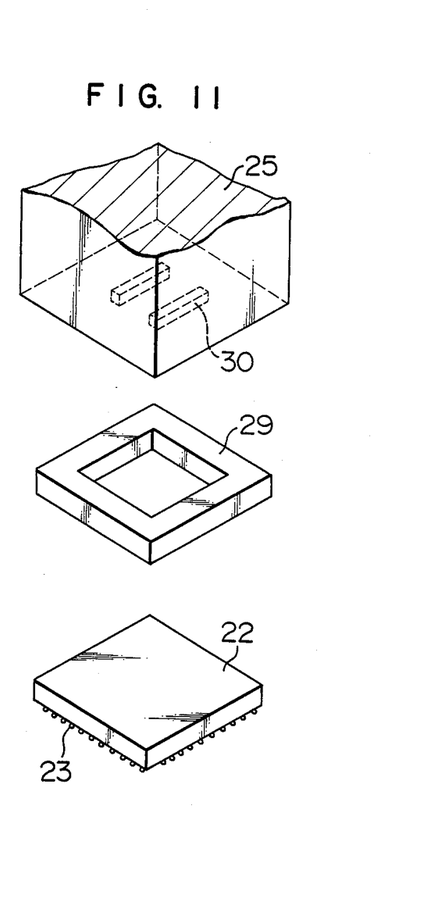
FIG. 11 is an exploded, perspective view showing members which are used in the second embodiment.

FIGS. 10A to 10C are sectional views showing a few steps of the present embodiment which can solve the above problem and can form a voidless solder layer, and FIG. 11 is an exploded perspective view showing members which are used in the present embodiment. In the present embodiment, protrusions 30 are formed on the bonding surface of the cooling block 25, to prevent fused solder from flowing out. Alternatively, a spacer having an appropriate thickness (for example, a thickness of 50 μm) may be attached to the bonding surface.

FIGS. 10A to 10C show steps corresponding to those of FIGS. 1A to 1C. As shown in FIG. 10B, when the tips of the protrusions 30 are put in contact with the silicon chip 22 by applying a vertical load W (which is indicated by an arrow) to the cooling block 25, a gap of 30 to 50 μm is formed between the silicon chip 22 and the cooling block 25, and thus fused solder is prevented from flowing out from the periphery of the silicon chip 22. Further, in the step of FIG. 10C, a voidless solder layer is formed for the same reason as explained in the step of FIG. 1C.

Figure 12A:
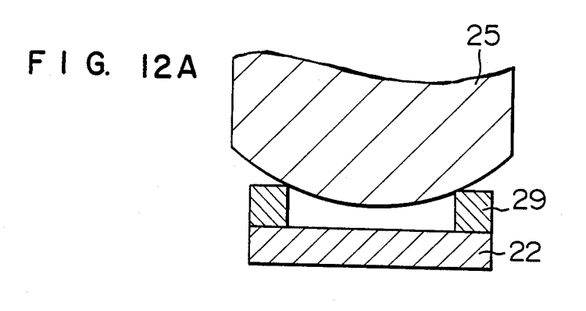
FIGS. 12A, 12B and 12C are sectional views for explaining a few steps of a modified version of the second embodiment.
Figure 12B:
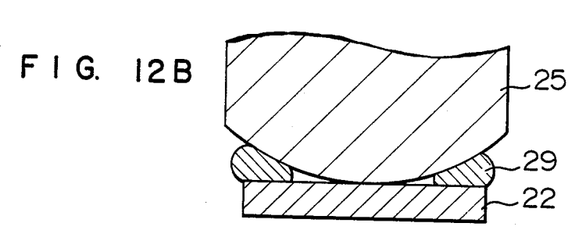
Figure 12C:
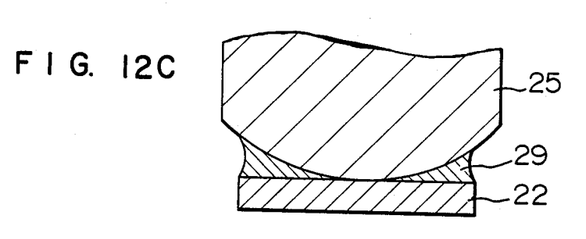

FIGS. 12A to 12C are sectional views showing steps of a modified version of the present embodiment. In this modified version, a spherical bonding surface is used as an unflat surface. FIGS. 12A to 12C show steps corresponding to those of FIGS. 1A to 1C. As shown in FIG. 12C, even when a spherical bonding surface is used, a homogeneous solder layer is formed, and a composite structure is accurately constructed.

Further, in a case where a spacer is attached to a bonding surface as mentiond above, or in a case where a bonding surface having protrusions or a spherical bonding surface is used, the thickness of the solder preform serving as an intermediate member can be unequivocally and readily determined.

As is evident from the above explanation, the present invention is applicable to a case where a bonding surface includes an unflat portion. In the present embodiment, a bonding surface having the protrusions 30 has been used, to solve the problem caused by a vertical load. In view of recent requirements such as the use of silicon chip having a large diameter and the enlargement of allowable mechanical tolerance of a constituent member, the formation of a voidless solder layer on an unflat surface according to the present invention is applicable to and can exhibit a remarkable effect in various fields.

In the EMBODIMENTS I and II, the solder preform is used as a fusible intermediate member. However, the effect of the present invention can be obtained independently of the kind and size of the fusible member, the kind and size of main members to be bonded to each other, and the set state of the fusible member, provided that the fusible member is disposed on a peripheral portion of the bonding surface of one main member.

Further, in a case where an adhesive agent is required to densely fill a region formed between the bonding surfaces of main members, the effect of the present invention can be obtained only by making the adhesive agent flowable at a time ambient pressure is increased. Thus, even when a fusible material other than solder, for example, an organic resin, is used, the present invention can produce the same effect as mentioned above.

In the EMBODIMENTS I and II, the ambient pressure P is first reduced to vacuum ($P_1$), and then increased to normal pressure ($P_2$). The void reduction which is the gist of the present invention is proportional to the pressure ratio $P_1/P_2$, and the initial pressure $P_1$ is so set as to be lower than the final pressure $P_2$. That is, it is not required to set the pressure $P_1$ as mentioned in the EMBODIMENTS, but the pressure $P_1$ is determined while taking into consideration the simplicity of operation. For example, when the pressure $P_1$ is made equal to normal pressure (760 Torr), the pressure $P_2$ is set to a pressure higher than 760 Torr. In this case, also, the present invention can produce the same effect as in the EMBODIMENTS.

As has been explained in the foregoing, according to the present invention, a solder layer for bonding is controllably formed which has very small in volume and is kept in close contact with the bonding surfaces of main members. Further, pure solder flows on the bonding surfaces in a state that the surface oxide film of solder has been broken, and hence fluxless soldering can be made. When a semiconductor chip is bonded to a heat sink in accordance with the present invention to form a composite structure, a solder layer formed between the chip and the heat sink will exhibit small thermal resistance and large bonding strength. Thus, the performance and reliability of the composite structure are greatly improved. Further, according to the present invention, even in a case where it is required from the practical point of view to apply a load to one of the main members, a solder layer is prevented from flowing out or flying apart from the bonding surfaces of the main members.

We claim:

1. A method for fabricating a composite structure, said composite structure being formed in such a manner that an intermediate member is sandwiched between first and second members said method comprising the steps of:
   disposing the intermediate member along only the periphery of a spatial region formed between facing surfaces of the first and second members so that said spatial region is enclosed by said intermediate member;
   increasing the fluidity of said intermediate member under an atmosphere having a predetermined pressure; and
   increasing the pressure of said atmosphere to make said intermediate member flow into said spatial region.

2. A method for fabricating a composite structure as claimed in claim 1, wherein a spacer means is previously provided between said first and second members so as to ensure a space between said first and second members wherein said intermediate member can flow upon increasing the fluidity thereof.

3. A method for fabricating a composite structure as claimed in claim 2, wherein said intermediate member has a thickness such that a gap is produced between said spacer means and at least one of said first and second members when said members and said spacer means are assembled.

4. A method for fabricating a composite structure as claimed in claim 3, wherein said intermediate member has a thickness larger than that of said spacer means.

5. A method for fabricating a composite structure as claimed in claim 1, wherein said intermediate member is a preform having a predetermined shape.

6. A method for fabricating a composite structure as claimed in claim 1, wherein said intermediate member is made of solder.

7. A method for fabricating a composite structure as claimed in claim 1, wherein said intermediate member is made of Pb-Sn solder.

8. A method for fabricating a composite structure as claimed in claim 1, wherein metallized layers are formed on those surfaces of said first and second members which are to be bonded to said intermediate member.

9. A method for fabricating a composite structure, said composite structure being formed in such a manner that an intermediate member is sandwiched between first and second members, said method comprising the steps of:
   disposing the intermediate member along only the pheriphery of a spatial region formed between facing surfaces of the first and second members so that said spatial region is enclosed by said intermediate member;
   reducing the pressure of an atmosphere, said first, second and intermediate members being disposed in said atmosphere;
   increasing the fluidity of said intermediate member under said atmosphere having a reduced pressure, by heating said intermediate member; and
   increasing the pressure of said atmosphere.

10. A method for fabricating a composite structure as claimed in claim 9, wherein the pressure of said atmosphere is made lower than atmospheric pressure in the pressure reducing step, and is returned to atmospheric pressure in the pressure increasing step.

11. A method for fabricating a composite structure as claimed in claim 9, wherein said intermediate member is a preform having a predetermined shape.

12. A method for fabricating a composite structure as claimed in claim 9, wherein said intermediate member is made of solder.

13. A method for fabricating a composite structure as claimed in claim 9, wherein said intermediate member is made of Pb-Sn solder.

14. A method for fabricating a composite structure as claimed in claim 9, wherein metallized layers are formed on those surfaces of said first and second members which are to be bonded to said intermediate member.

15. A method for fabricating a composite structure as claimed in claim 10, wherein the pressure of said atmosphere is made lower than one-hundredth of atmospheric pressure in said pressure reducing step.

16. A method for fabricating a composite structure as claimed in claim 8, wherein said first member is an integrated circuit chip, said member is a ceramic heat sink and said intermediate member is a solder preform.

17. A method for fabricating a composite structure as claimed in claim 16, wherein the pressure within said spatial region is reduced by reducing the pressure of said atmosphere.

18. A method for fabricating a composite structure as claimed in claim 17, wherein said solder preform is kept in close contact with said metallized layers upon increasing the fluidity of said intermediate member.

19. A method for fabricating a composite structure as claimed in claim 18, wherein a volume of said spatial region is reduced by increasing the pressure of said atmosphere.

20. A method for fabricating a composite structure as claimed in claim 17, wherein an intermetallic reaction is generated between said solder preform and said metallized layers upon increasing the fluidity of said intermetallic member.

21. A method for fabricating a composite structure as claimed in claim 20, wherein a volume of said spatial region is reduced by increasing the pressure of said atmosphere.

* * * * *